May 17, 1960 R. W. ALDRICH ET AL 2,937,289
DIGITAL TO ANALOGUE CONVERTER
Filed Sept. 3, 1954
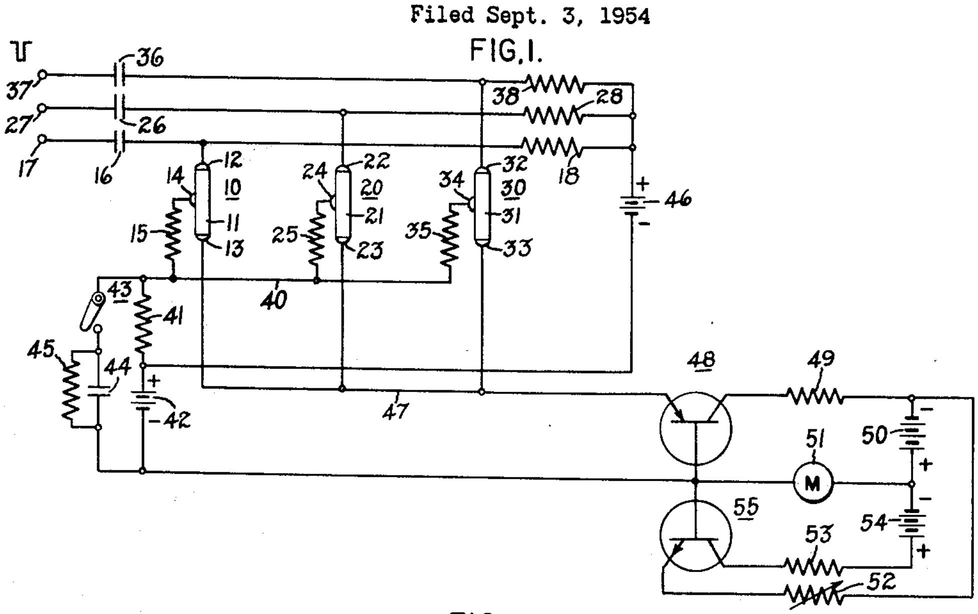
FIG. I.
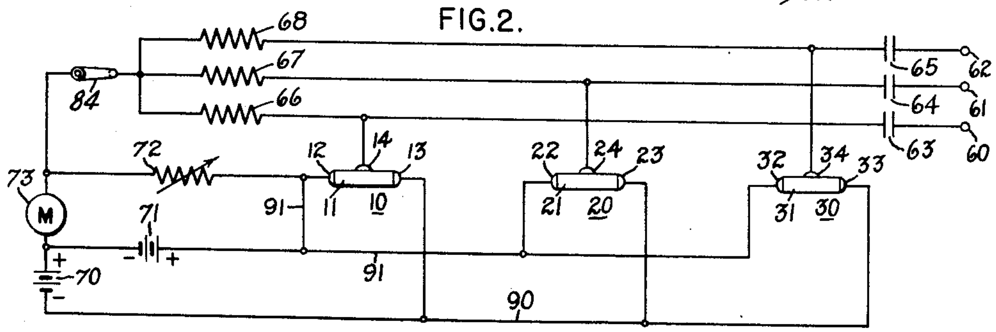
FIG. 2.
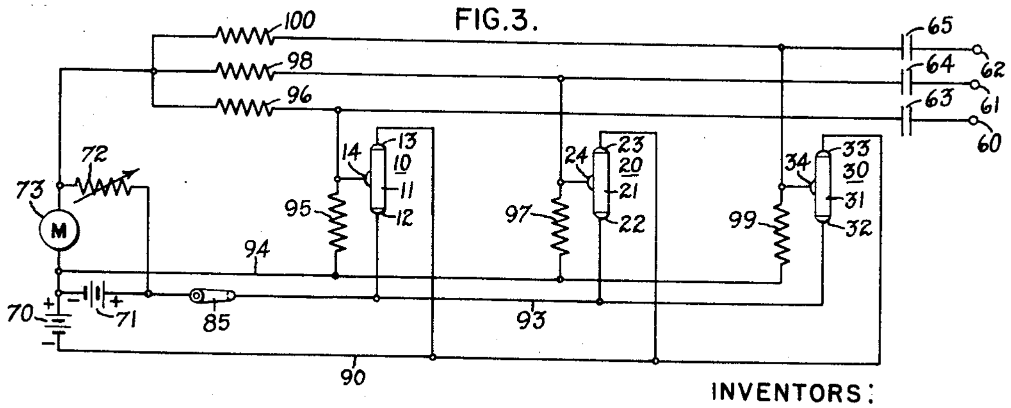
FIG. 3.
INVENTORS:
JEROME J. SURAN,
RICHARD W. ALDRICH,
BY George V. Eltgroth
THEIR ATTORNEY.

2,937,289

DIGITAL TO ANALOGUE CONVERTER

Richard W. Aldrich, Liverpool, and Jerome J. Suran, Syracuse, N.Y., assignors to General Electric Company, a corporation of New York Application September 3, 1954, Serial No. 454,172
4 Claims. (Cl. 307—88.5)

This invention relates to triggered networks exhibiting multiple degrees of stability, and more particularly to arrays utilizing such networks for the interpretation of pulse coded information.

The handling of information with techniques based upon combinations of discrete electric impulses involves the use of very large assemblages of apparatus with correspondingly large power requirements. Expansion of the field of application of devices utilizing such complex techniques demands a reduction in physical size, and minimization of power supply requirements, while retaining a high degree of reliability. Vernon P. Mathis and Jerome J. Suran, in application Serial No. 432,816, Filed May 27, 1954, now Patent No. 2,802,117, entitled "Semi-Conductor Network" and in application Serial No. 436,970, filed June 15, 1954, now Patent No. 2,820,152 entitled "Semi-Conductor Network," both of which are assigned to the assignee of the instant invention, have described bi-stable networks utilizing a semiconductor body provided with spaced "ohmic" electrodes and a single rectifying junction. In the course of work directed to the realization of the the aforementioned aims, it has been found possible through further extension, development and modification in the teachings of Mathis and Suran to achieve these worthy goals.

Accordingly, it is a principal object of the invention to provide a new and novel combination utilizing the properties of networks exhibiting multiple degrees of stability.

Another object of the invention is to provide new and novel networks utilizing the properties of single junction semiconducting devices.

Still another object of the invention is to provide method and means for decoding information in the form of electric impulses.

A further object of the invention is to provide a new and novel storage register.

Yet another object of the invention is to provide a new and novel network for storing and decoding electrically encoded information.

These and other objects and advantages of the invention will be more fully discussed in, and others will become apparent from the study of, the following specification when read in conjunction with the drawings, which show a limited number of specific embodiments for the purpose of illustrating the principles of the invention. The invention is pointed out with particularity in the appended claims forming a part of this specification.

In the drawings:

Fig. 1 is a schematic diagram of a decoding network adapted to respond to the application of impulses to ohmic contacts associated with the members of a group of semiconducting bodies; and Fig. 2 illustrates schematically a decoding network adapted to respond to the application of electric impulses, to the rectifying junctions if a group of single junction semiconductor networks, and Fig. 3 illustrates schematically a decoding network responding to electric impulses applied to the junction electrodes of a group of single junction semiconductor devices in which the decoded output is derived from the junction currents.

Referring now in detail to Fig. 1, there appear the respective semiconductor devices 10, 20, 30, each consisting of a body 11, 21, 31, of semiconducting material such as germanium or silicon in crystalline form, to which a suitable admixture of a donor or acceptor impurity has been added. In the particular example shown, the use of an N-type semiconductor has been assumed for the purposes of illustration. Thus the semiconducting body might be germanium with a small admixture of phosphorus, arsenic or antimony. Physically the semiconducting body 11, 21, 31 may, when of such N-type germanium, have a length of .035 inch and a cross section of .010 by .010 inch.

At one point along the length of each of these rod like members or bars there may be affixed an "ohmic" electrode, that is to say an electrode having predominantly bilaterally conductive properties. As described in the earlier mentioned applications, such "ohmic" electrodes may be produced by spraying molten tin on the surface of the germanium. At another point on the bar, there may be affixed an additional "ohmic" electrode indicated at 13, 23, 33. A junction electrode is situated on each bar at a region whose potential is controlled by the voltage gradient existing between the spaced "ohmic" electrodes. The junction electrodes, indicated respectively at 14, 24, 34, are possessed of rectifying properties and may be formed on N-type germanium by placing a dot of indium in the proper location, followed by baking at a suitable tempreature for the time necessary to produce the desired degree of diffusion of the indium into the germanium. Thereafter the junction properties are further developed by forming treatment using voltage and current in accordance with practices well-known to those skilled in the art. This detailed information with respect to the structure of the semiconductor devices per se, is by way of general background reference only and is not intended to constitute a limitation upon the invention.

The junctions 14, 24, 34 are respectively connected through resistances 15, 25, 35 with the connecting line 40. The line 40 is connected through resistor 41, which may be about 50 ohms, to the positive pole of source 42, supplying a potential of about three volts. In addition, the line 40 is also connected with one pole of the normally open, momentary contact switch 43, whose other pole is connected with the negative pole of the source 42 through the shunt connected capacitor 44 and resistance 45.

Each of the resistances 15, 25, 35 is chosen to have a magnitude imparting bistable properties to its associated network. This is done by satisfying the requirement that the load line of the circuit including such resistor intersect the voltage-current characteristic of its associated junction at two points displaying a positive slope, as explained in the above referenced applications for U.S. patent. The relative magnitudes of the resistances 15, 25, 35 are determined by the weighting factors to be accorded the members of the code group of electric impulses applied to the network. The number of such possible codes is legion. For illustrative purposes, it will suffice to select the simplest, which is a straightforward system of binary code representation of numerical quantities, in the well known form:

| Decimal: | Binary |
|---|---|
| 0 | 000 |
| 1 | 001 |
| 2 | 010 |
| 3 | 011 |
| 4 | 100 |
| 5 | 101 |
| 6 | 110 |
| 7 | 111 |

When the network including the semiconductor 30 is assigned the task of accommodating the most significant binary digit, the resistor 35 is selected to satisfy the conditions for the existence of two possible stable current states through the junction 34, and to give rise to the flow of four units of current through the junction 34 when there exists the state corresponding to maximum conduction through such junction 34. A value of approximately 1,000 ohms will satisfy these conditions. The network including the semiconducting device 20 accommodates the next less significant primary digit, and accordingly the value of the resistance 25 is selected to permit the flow of two units of current in the junction 24, when this portion of the network is in the electrical state corresponding to the maximum conduction through the junction 24. The portion of the network including the semiconducting device 10 accommodates the least significant binary digit of the input code, and accordingly the resistance 15 is selected to permit passage of one unit of current through the junction 14 when the network portion including the semiconducting device 10 is in its maximum state of conductivity.

The upper ohmic electrode 12 of the semiconductor 10 is linked with input terminal 17 by capacitor 16, and is connected with the positive pole of the source 46 through resistor 18. The negative pole of the source 46, which may have a potential of 9 volts, is connected with the positive pole of the source 42.

In like manner, the ohmic electrode 22 of the semiconducting device 20 is connected with the input terminal 27 through coupling capacitor 26 and to the positive pole of the source 46 through resistor 28. The ohmic electrode 32 of the semiconducting device 30 is connected with input terminal 37 through coupling capacitor 36 and to the positive pole of the source 46 through a resistor 38. The resistors 18, 28, 38 may each be approximately 1,000 ohms. The magnitude of the coupling capacitors 16, 26, 36 is dependent upon the resistances 18, 28, 38 and the characteristics of the semiconductors 10, 20, 30, in additon to the waveform and power content of the signal impulses. In general, a value of one microfarad for each capacitor 16, 26, 36 is satisfactory.

The other ohmic electrodes 13, 23, 33 of the semiconductors, 10, 20, 30, are connected in common with the line 47, which is linked to the emitter of the p-n-p transistor 48, whose base is connected with the negative pole of the source 42. The application of negative going electric impulses to input terminals 17, 27, 37, serves to drive the networks including semiconductors 10, 20, 30 into their triggered state. The switch 43 with associated capacitor 44 and resistor 45 provides a means for restoring all the networks to a rest state of low conductivity. For this purpose, the magnitudes of capacitor 44 and resistance 45 are selected to permit discharge of the capacitor 44 in the interval when information is being entered into and utilized in the network described. If the switch 43 is manually operated, a time constant of $\frac{1}{10}$ second is suitable for these elements, resulting in a value of ten microfarads for capacitor 44 and 10,000 ohms for the resistance 45. A further requirement is that the value of capacitor 44 be adequate to insure that all the junctions 14, 24, 34 are driven into the low reverse current state by the development of a negative going impulse across the resistor 41 when the switch 43 is momentarily closed. It will be observed that the currents flowing through the ohmic electrodes 13, 23, 33 are combined, and the combined result then appears as emitter current in the transistor 48. As mentioned, the transistor 48 is of the p-n-p type. The collector circuit for the transistor 48 includes a resistance 49, which may be about 5,000 ohms, connected with the negative pole of the source 50, of about 9 volts. The positive pole of the source 50 is connected with the base of the transistor 48 through indicating device 51.

As has been indicated, closure of the momentary switch contacts 43, places all the semiconductor networks of Fig. 1 in their minimum conductivity condition. At this time, there occurs a certain residual flow of current through the body of the semiconductors 10, 20, 30, giving rise to emitter current in the transistor 48 and a steady deflection of the indicating device 51. This current may be compensated by the addition of the transistor 55, of the n-p-n type with its base connected to the base of the transistor 48, and its emitter electrode connected through adjustable resistance 52 with the negative pole of the source 50. The collector of the transistor 55 is connected through a resistance 53, which may be about 5,000 ohms, to the positive pole of the source 54, which may also have a potential of about 9 volts. The collector circuit for the transistor 55 is completed by the connection of the negative pole of the source 54, together with the positive pole of the source 50, to the indicating device 51. With all networks in their minimum current state, the collector current of the transistor 55 is varied by adjusting resistance 52 until the residual current flow in the meter 51 has been balanced out. It is desirable that the temperature coefficient and thermal time constant of both transistors 48 and 55 be quite similar to insure that the balanced condition continues to exist throughout the range of operating temperatures likely to be encountered.

The network of Fig. 1 is particularly adapted to produce in the indicating device 51 a current corresponding in magnitude to the code significance of electric impulses which are separated in a space frame notation, i.e., are situated in substantially independent electrical circuits. For example, the input terminals 17, 27, 37 may be connected with the various stages of a storage register through read-out gates, which are normally closed and which are opened either simultaneously or sequentially during the read-out cycle. When the read-out has been completed, the register contents are stored in the network of Fig. 1, and, at the same time, a decoded indication of the contents is available on the indicating device 51. If the intelligence conveying impulses are of sufficient duration and power, they may be applied directly to the input terminals 17, 27, 38 whereby the network of Fig. 1 acts at once as a storage register and decoding device.

It has been mentioned earlier that this network may be used in the decoding of electrical pulse notations having purely binary significance. In such event, the existence of current flow through the semiconductor 10 has one unit of significance, the existence of current flow through semiconductor 20 has two units of significance, and the existence of current flow through semiconductor 30 and four units of significance. As is customary the weighting factors accorded to the existence of current flow in various stages corresponds to $2^n$, where "$n$" is the order or significance to be accorded with the "$n$"th order pulse.

The static current and voltage conditions, taken in conjunction with the impedances in the network, are so selected that the current flow through the junction 14 of the network including the semiconductor 10, which will be discussed by way of example, remains in the existing state until positively transferred to its other electrical state of conduction. The potential applied by the source 42 is such as to leave the junction 14 with a small reverse bias with respect to the body 11 with small or negligible current flow through the resistor 15. When a negative going impulse is now applied to the input terminal 17, the potential gradient along the body 11 is reduced, while the potential of the junction 14 remains substantially unchanged, so that the junction electrode 14 becomes positive with respect to the body and the condition of high forward current flow is established. The application of a negative going impulse to terminals 27 or 37 produces the same effect, respectively, in the semiconductor devices 20, 30. As noted earlier, the circuit constants are so chosen that if a pulse be applied to terminal 17, no pulse applied to terminal 27 and a pulse applied to terminal 37 corresponding to the binary notation 101, five units of controlled current flow through indicating device 51.

To prepare the circuit for operation, the switch 43 is closed momentarily. The current surge when the capacitor 44 is charged from the source 42 instantaneously brings the junction electrode end of the resistor 41 to the potential of the negative pole of the source 42 whereby the conditions for small reverse current flow are simultaneously established at all of the junctions 14, 24, 34. This places all the members of the network in a reference condition of low or minimum conductivity. When the momentary switch 43 is restored to its open position, the shunting resistor 45 discharges capacitor 44, preparing it for the next restoring operation. While all the circuits remain in the condition of minimum conductivity the magnitude of resistance 52 is adjusted as above noted to make the collector current in transistor 55 substantially equal to that of transistor 48. This reduces the flow of current through meter 51 to zero and eliminates the effect of the residual minimum current flow observed when all circuits are in their condition of minimum conductivity. Thereafter, the impulses to be decoded are applied with negative going polarity to the input terminals 17, 27, 37 in the proper space frame notation, whereupon their decoded results may be read directly on the indicating device 51. While manually operated arrangement for restoration of the network to its reference condition has been shown, this has been done for simplicity of presentation only. It is obviously most desirable that the restoration be interlocked to occur with the ending of the period for utilization of the decoded information, or, with the ending of the period when the continued storage of the information present in the incident electrical impulses is required.

An alternative arrangement for the utilization of single junction semiconducting devices as storage registers and decoding networks appears in Fig. 2 which also illustrates semiconducting devices 10, 20, 30 comprising respectively a semiconductor body 11, 21, 31 which may be of germanium or silicon with the proper admixture of donor or acceptor substances. As before, there is provided at one location on the body 11, 21, 31 an "ohmic" or bilaterally conductive contact 12, 22, 32, and, spaced therefrom, a second "ohmic" contact 13, 23, 33. Intermediately situated thereof is the junction electrode 14, 24, 34, established and processed as outlined above.

The electrodes 12, 22, and 32 are connected together and, over the line 91, with the positive pole of the source 71 which may have a potential of about 6 volts. The negative pole of the source 71 is connected with the positive pole of source 70, having a potential of about 3 volts, and the negative pole of the source 70 is connected over the line 90 with the electrodes 13, 23, 33 of the semiconductors 10, 20, 30. An indicating device 73 is connected, in series with an adjustable resistance 72, across the source 71. Resistances 66, 67, 68 are respectively connected with the junctions 14, 24, 34 at one end and, in common at the other end to one pole of the normally closed momentary switch 84. The other pole of the switch 84 is connected with the junction between the resistance 72 and indicating device 73. The relative magnitudes of the resistances 66, 67, 68 are determined by the weight or significance to be accorded the impressed electrical impulses. All of their resistances must be such that there exist two stable load line intercepts with the negative resistance characteristic of their associated semiconducting device.

If it is desired to decode electrical impulse information in purely binary notation, then the relative magnitudes of these resistors are so adjusted as to provide current through their associated junctions in the ratios 1, 2, 4. Assuming the stage incorporating semiconductor 30 is assigned the task of accommodating the most significant digits of the decoded pulse group, the resistor 68 will be chosen to provide the two stable load line intercepts with the desired degree of reliability, and the resistances 67, 66 are then selected to provide in junction 24 in the maximum conductivity state a current one-half that existing at junction 34 when driven to the maximum conductivity state and to provide in junction 14 a current in the maximum conductivity state of approximately one-fourth of that observed in junction 34 in the maximum conductivity state. Triggering impulses are applied to the junction 14 by capacitor 63 connected between junction 14 and the input terminal 60. A similar capacitor 64 is connected between the junction 24 and input terminal 61, while capacitor 65 is connected between junction 34 and input terminal 62. As before, the magnitude of the capacitors 63, 64, 65 is largely controlled by the signal and network characteristics. A value of one microfarad is satisfactory when the resistances 66, 67, 68 lie in the range 2,000–15,000 ohms.

The network array may be restored to uniform reference junction current conditions by opening and reclosing normally closed reset switch 84. This places all junctions, 14, 24, 34 in the condition of small reverse current flow. With the network in this condition, the residual junction current flow causes a deflection of the meter 73, which may be compensated by adjustment of the variable resistor 72. The residual current in the network of Fig. 2, is somewhat less than that in Fig. 1, since only the junction back current is involved, while in Fig. 1 the interbase current is included, as well as the junction back current.

With very high ratios of forward to reverse junction current, therefore, the compensating resistance 72 may be omitted.

The networks of Fig. 2 are triggered by the application of positive going impulses to the respective input terminals. With straightforward decoding of binary code to analogue or continuous variable, the application of a positive going signal to input terminal 60 establishes one unit of current flow through resistance 66, a positive impulse applied to input terminal 61 establishes two units of current flow through resistance 67, and the application of a positive going impulse to input terminal 62 establishes four units of current flow through the resistance 68. The current flow, once established, continues until the network is restored to its original condition by momentary operation of the switch 84. Therefore, the network of Fig. 2 serves as a storage register, in addition to performing a decoding function.

As earlier noted, another storage register, sensed through an appropriate array of read-out gates, may be used as the source of impulses for the input terminals 60, 61, 62. Alternatively, if serial information is being accommodated, the information may be delivered to the storage and decoding network of Fig. 2 through the usual delay configuration and distribution gates. One such arrangement comprises a recording location and a plurality of gated sensing stations disposed about the periphery of a revolving magnetic drum. Many others will be obvious to those skilled in the art.

At the end of the time needed for the utilization of the decoded information or for reference to the quantities stored in the register of Fig. 2, a negative signal is applied to the control element of a switching device, such as a transistor, in place of switch 84 to restore the junctions 14, 24, 34 to their reverse current condition. Although, as shown in Fig. 2, the reset function is performed manually, it is obvious that it may be exercised in response to the end of the computation or control operation through any of the usual expedients.

It will be noted that the alternative arrangements of

Fig. 1 and Fig. 2 as shown are respectively responsive to negative going and to positive going signal impulses.

If complementary indications are required, then the network of Fig. 2 may be made responsive to negative going impulses through relocating the switch 84 to remove potential from the base electrodes 12, 22, 32. Actuation of the switch 84, with this alternative arrangement places all of the networks in their condition of maximum conductivity and the current flow through each is reduced with the application of a negative going impulse, which correspondingly modifies the stable value of the current flowing through the associated junctions 14, 24, or 34.

Each of the storage register and decoding networks so far described has been characterized by junction currents which are different in the different stages. When these junction currents differ, the power requirements for triggering the individual stages also differ.

The network of Figure 3 provides for equal junction currents and equal driving impedances, while maintaining the desired ratios between the stimuli delivered to the indicating device from the various stages.

Since much of the configuration of Figure 3 resembles the arrangement of Figure 2, corresponding reference characters have been used to identify corresponding network elements. The decoder-register network of Figure 3 includes semiconducting devices 10, 20, 30. The device 10 has an upper ohmic electrode 13 connected over the line 90 with the negative pole of the source 70. In similar fashion, the upper ohmic electrode 23 of the device 20, and the upper ohmic electrode 33 of the device 30 are also connected with the line 90. The lower ohmic electrode 12 of the device 10, the lower ohmic electrode 22 of the device 20, and the lower ohmic electrode 32 of the device 30 are connected together over the line 93, which is linked to one contact of the normally closed momentary switch 85, whose other contact is connected with the positive pole of the source 71. The positive pole of the source 70 and the negative pole of the source 71 are connected together and to the line 94, which is connected with the junction electrode 14 of the device 10 through the resistance 95, to the junction electrode 24 of the device 20 through the resistance 97, and to the junction electrode 34 of the device 30 through resistance 99.

The indicating or output device 73 has one terminal connected with the line 94, and its other terminal connected through resistance 96 with the junction electrode 14 of the device 10, through the resistance 98 with the junction electrode 24 of the device 20, and through the resistance 100 to the junction 34 of the device 30. A resistance 72 connected between the positive pole of the source 71 and the common resistance terminal of the load device 73 provides for cancellation of residual currents which may flow in the network, as previously outlined.

Triggering impulses are applied to the junction 14 by the capacitor 63 connected between junction 14 and input terminal 60. A similar purpose is served by the capacitor 64 connected between the input terminal 61 and the junction 24, and by the capacitor 65 connected between the input terminal 62 and the junction 34.

The resistance pairs 95, 96; 97, 98; and 99, 100 are so selected that the sum of their conductances is a constant, and their relative values are chosen within this limitation to provide the desired current division through the load device 73. When these conditions are satisfied, the junction currents flowing in each of the semi-conducting devices 10, 20, 30 are equal when in corresponding electrical states. The impedances of each of the network sections viewed from its corresponding input terminal are also equal, thereby making the loading conditions reflected on the trigger source identical and simplifying design problems.

The equal junction currents influence the load device 73 differently, because of the variable division factors effected by proper choice of the relative magnitudes of resistances such as 95, 96 in the junction circuit of the semi-conductor 10, and the corresponding elements associated respectively with the semi-conducting devices 20, 30. Adhering to the relatively simple example of binary decoding, the current caused to flow in the indicating device 73 by semi-conductor 10 may be given the weight $2^0$, while that due to the device 20 has the weight $2^1$ and that due to the device 30 has the weight $2^2$. Stated otherwise, the stage accommodating the "$n$"th order digit of a binary number must provide an indication of weight $2^n$.

Generally speaking, the resistance connected between the semi-conductor junction and the indicating device 73 may be designated as $R_n$ while the resistance connected between the corresponding junction and the line 94 may be designated by the notation $R'_n$, where "$n$" indicates the order of the binary digit being accommodated by the network stage with which this resistance pair is associated. The requirements which have been verbally expressed are satisfied when the following relationships exist:

$$\frac{1}{R_n}+\frac{1}{R'_n}=K \qquad (1)$$

The fraction of the junction current passing through the load device 73 is given by the relationship:

$$\frac{\frac{1}{R_n}}{\frac{1}{R_n}+\frac{1}{R'_n}}=\frac{1}{KR_n} \qquad (2)$$

In the decoding of binary information, it is necessary that the ratio between the current contribution from the "$n$"th stage and the current contribution from the 0th stage be given by the expression:

$$\frac{\frac{1}{KR_n}}{\frac{1}{KR_o}}=2^n=\frac{R_o}{R_n} \qquad (3)$$

where $R_0$ is the resistance between the active junction and the current feed terminal of the load device in the stage accommodating the least significant binary digit.

Using $R_0$ as a reference, the corresponding resistance in each stage of the decoder is found to be:

$$R_n=\frac{R_o}{2^n} \qquad (4)$$

since, according to (1):

$$R'_n=\frac{R_n}{KR_n-1} \qquad (5)$$

then:

$$R'_n=\frac{R_o}{KR_o-2^n} \qquad (6)$$

The operation of the network shown in Figure 3 closely resembles the operation of the network in Figure 2. The various stages are all placed in their low-current reference condition by momentarily opening the switch 85. Thereafter, the application of a positive pulse to any one or more of the input terminals 60, 61, 62 drives the corresponding triggered stage into its high current state of stability, where it remains until reset. All of the junctions so triggered pass substantially the same amount of current, varying excitation of the indicating device 73 being obtained by reason of the different current division factors existing in the different stages due to the use of different values for the resistance pairs feeding the junction.

For example, the current flowing to the junction 14 is divided, the metered portion flowing through resistance 96, while the unmetered portion flows through the resistance 95. The resistance 96 may be taken as $R_0$ in the foregoing equations, provided it is large compared with the forward resistance of the junction 14.

The resistances 97, 98 in the stage including device 20 divide the current differently, due to the different ratios between the resistors. In this stage, the resistance 98 is proportioned to pass a larger fraction of the junction current through the indicating device 73, the balance of the current flowing through resistance 97.

Similar conditions exist in the circuit feeding the junction 34, the proportioning of the resistances 99, 100 being such that a still larger fraction of the junction current flows through the resistance 100 to the metering or indicating device 73.

In each of the networks described, the triggering energy has been applied through a coupling capacitor. While this is perhaps the most frequently encountered method of impressing triggering energy, other expedients may be used, as well. For example, when decoding and registering information stored in the form of punched apertures in a tally sheet, or card, an optical system scanning the aperture pattern may be provided with an optical distributing system impressing aperture controlled illumination directly on corresponding junctions to effect the photoelectric control directly, by reason of the photoexcitation of the active junction of the semi-conductor body.

The specific embodiments shown and discussed have been chosen to illustrate the principles of the invention. As is well known to those skilled in the art, the array and disposition, number or character of elements may be varied to meet particular operating or environmental requirements without departing from the essence of the invention.

What is claimed as new and to be secured by Letters Patent of the United States is:

1. In combination, a plurality of electric devices each comprising a semiconducting member exhibiting a negative resistance region bounded by regions of positive resistance having operational stability provided with first and second spaced predominantly bilaterally conducting electrodes and an electrode connection with a predominantly unilaterally conducting junction disposed in a region of said member affected by the potential gradient established in said member by the application of electric potentials between said bilaterally conducting electrodes, common indicating means connected in circuit with said first and second bilaterally conducting electrodes of each of said devices for applying said electric potentials, means including separate impedances of different magnitudes for impressing on each of said junction electrodes a potential lying within the range of potential defined by the potentials of said bilaterally conducting electrodes, said means establishing a first non-conducting, and a second, current conducting, stable state of operation in said positive resistance regions for each of said devices, the magnitude of current conduction of each of said devices being different when operating in said second state, means for jointly applying electrical signals from a first source to each of said devices to establish a common stable state of operation in each device, means for individually applying electrical signals from a second source to each of said devices to selectively vary the state of operation of said devices upon the occurrence of an electrical signal, said indicating means being constructed to be responsive to the joint current conduction through the devices which are in said second stable state of operation.

2. In combination, first and second electric devices each comprising a semiconducting member exhibiting a negative resistance region bounded by regions of positive resistance having operational stability provided with spaced predominantly bilaterally conducting electrodes and an electrode connection with a predominantly unilaterally conducting junction disposed in a region of said member affected by the potential gradient established in said member by the application of different electric potentials to said bilaterally conducting electrodes, means including common indicating means connected in common with one bilaterally conducting electrode of each of said devices and separately through separate impedances to said junction electrode of each of said devices, means for applying said different electric potentials between said bilaterally conducting electrodes, means including separate impedances of different magnitudes for impressing on each of said junction electrodes a potential lying within the range of potential defined by the potentials of said bilaterally conducting electrodes, said means establishing a first nonconducting, and a second, current conducting, stable state of operation in said positive resistance regions for each of said devices, means for individually applying electrical signals to each of said junction electrodes to selectively vary the state of operation of said devices upon the occurrence of an electrical signal, said indicating means being constructed to be jointly responsive to a different preselected portion of the currents flowing in each of said junction electrodes of the devices which are in said second stable state of operation.

3. In combination, first and second electric devices each comprising a semiconducting member exhibiting a negative resistance region bounded by regions of positive resistance having operational stability provided with spaced predominantly bilaterally conducting electrodes and an electrode connection with a predominantly unilaterally conducting junction disposed in a region of said member affected by the potential gradient established in said member by the application of different electric potentials to said bilaterally conducting electrodes, means including common indicating means connected in common with one bilaterally conducting electrode of each of said devices and separately through separate impedances to the other bilaterally conducting electrode of each of said devices for applying different electric potentials between the bilaterally conducting electrodes of each of said devices, means including separate impedances of magnitude differing by substantially integral numerical ratios for impressing on each of said junction electrodes a potential lying within the range of potential defined by the potentials of said bilaterally conducting electrodes, said means establishing a first nonconducting, and a second, current conducting, stable state of operation in said positive resistance regions for each of said devices, means for individually applying electrical signals to each of the members of each of said sets of bilaterally conducting electrodes to selectively vary the state of operation of said devices upon the occurrence of an electrical signal, said indicating means being constructed to be jointly responsive to the current flowing in said one bilaterally conducting electrode of the devices which are in said second stable state of operation.

4. In combination, first and second electric devices each comprising a semiconducting member exhibiting a negative resistance region bounded by regions of positive resistance having operational stability provided with spaced predominantly bilaterally conducting electrodes and a predominantly unilaterally conducting junction electrode disposed therebetween in a region of said member affected by the potential gradient established in said member by the application of a potential difference across said bilaterally conducting electrodes, means including common indicating means connected in common with one bilaterally conducting electrode of each of said devices and separately through separate impedances of different preselected magnitudes to said junction electrode of each of said devices, means for applying said potential difference across said bilaterally conducting electrodes, means connecting said separate impedances to an intermediate point on said potential difference for impressing a potential lying in the region of said difference on said junction electrodes, means establishing a first nonconducting, and a second, current conducting, stable state of operation in said positive resistance regions for each of said devices, means for applying electrical signals individually across each of said junction electrodes and a bilaterally conducting electrode on its associated device to selectively vary the state of operation of said devices upon the occurrence of an electrical signal, said indicating means being constructed to be jointly responsive to the same preselected ratio of the currents flowing in each of said junction electrodes of the devices which are in said second stable state of operation.

References Cited in the file of this patent

UNITED STATES PATENTS

| | | |
|---|---|---|
| 2,486,391 | Cunningham | Nov. 1, 1949 |
| 2,502,479 | Pearson et al. | Apr. 4, 1950 |
| 2,557,729 | Eckert | June 19, 1951 |
| 2,584,720 | Lawson | Feb. 5, 1952 |
| 2,648,805 | Spenke | Aug. 11, 1953 |
| 2,651,728 | Wood | Sept. 8, 1953 |
| 2,709,770 | Hansen | May 31, 1955 |
| 2,718,634 | Hansen | Sept. 20, 1955 |
| 2,722,649 | Immel et al. | Nov. 1, 1955 |
| 2,731,631 | Spaulding | Jan. 17, 1956 |
| 2,738,504 | Gray | Mar. 13, 1956 |
| 2,767,908 | Thomas | Oct. 23, 1956 |
| 2,770,728 | Herzog | Nov. 13, 1956 |
| 2,813,934 | Cibelius et al. | Nov. 19, 1957 |

FOREIGN PATENTS

| | | |
|---|---|---|
| 166,162 | Australia | Dec. 1953 |